US010999944B2

(12) United States Patent
Park et al.

(10) Patent No.: US 10,999,944 B2
(45) Date of Patent: May 4, 2021

(54) STRUCTURAL DEVICE COVER

(71) Applicant: Microsoft Technology Licensing, LLC, Redmond, WA (US)

(72) Inventors: Daniel C. Park, Woodinville, WA (US); Anthony J. Hewett, Duvall, WA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 58 days.

(21) Appl. No.: 15/139,197

(22) Filed: Apr. 26, 2016

(65) Prior Publication Data
US 2017/0311464 A1  Oct. 26, 2017

(51) Int. Cl.
*F16M 11/10* (2006.01)
*H05K 5/02* (2006.01)
(Continued)

(52) U.S. Cl.
CPC ........... *H05K 5/0226* (2013.01); *F16B 5/121* (2013.01); *F16M 11/10* (2013.01); *F16M 11/2021* (2013.01); *F16M 11/2092* (2013.01); *F16M 11/24* (2013.01); *F16M 11/38* (2013.01); *G06F 1/1601* (2013.01); *G06F 1/1616* (2013.01); *H05K 5/0017* (2013.01);
(Continued)

(58) Field of Classification Search
USPC .... 248/441.1, 444, 447, 454, 455, 457, 458, 248/460, 371, 372.1, 393, 395, 397, 130, 248/132, 133, 135, 136, 138, 139, 141, 248/149, 150, 917, 919, 920, 921, 922, 248/923, 924; 361/679.04, 679.06
See application file for complete search history.

(56) References Cited

U.S. PATENT DOCUMENTS 3,955,241 A   5/1976 Little
4,006,839 A   2/1977 Thiel et al.
(Continued)

FOREIGN PATENT DOCUMENTS

CN       1310113 C    4/2007
CN     101373037 A    2/2009
(Continued)

OTHER PUBLICATIONS

Notice of Allowance dated Apr. 20, 2017 from U.S. Appl. No. 15/099,238, 38 pages.
(Continued)

*Primary Examiner* — Alfred J Wujciak
(74) *Attorney, Agent, or Firm* — Rainier Patents, P.S.

(57) ABSTRACT

The description relates to devices that can include a hollow arm that has an open side and a cover engaging region around the open side. The cover engaging region defines a first width at the open side, a second width farther from the open side, and a third width that is farther from the open side than the first width and the second width. The device can also include an arm cover that includes an arm engaging region. The arm engaging region can define a fourth width at the open side, a fifth width farther from the open side, and a sixth width that is farther from the open side than the fourth width and the fifth width. The sixth width can be greater than the fifth width and the second width and less than the first width and the fourth width.

20 Claims, 11 Drawing Sheets

(51) Int. Cl.
*H05K 5/00* (2006.01)
*G06F 1/16* (2006.01)
*F16B 5/12* (2006.01)
*F16M 11/20* (2006.01)
*F16M 11/24* (2006.01)
*F16M 11/38* (2006.01)

(52) U.S. Cl.
CPC ..... *H05K 5/0234* (2013.01); *F16M 2200/041* (2013.01); *F16M 2200/044* (2013.01); *F16M 2200/063* (2013.01)

(56) References Cited

U.S. PATENT DOCUMENTS

| | | |
|---|---|---|
| 4,246,802 A | 1/1981 | Rasmussen et al. |
| 4,438,458 A | 3/1984 | Munscher |
| 4,447,026 A | 5/1984 | Maraghe |
| 4,589,613 A | 5/1986 | Opsahl |
| 4,802,605 A | 2/1989 | Salmon et al. |
| 4,825,395 A | 4/1989 | Kinser et al. |
| 4,834,329 A | 5/1989 | Delapp |
| 5,200,913 A | 4/1993 | Hawkins et al. |
| 5,235,495 A | 8/1993 | Blair et al. |
| 5,239,730 A | 8/1993 | Grass |
| 5,278,725 A | 1/1994 | Konno et al. |
| 5,394,297 A | 2/1995 | Toedter |
| 5,498,165 A | 3/1996 | Tseng |
| 5,600,868 A | 2/1997 | Tourville et al. |
| 5,640,690 A | 6/1997 | Kudrna |
| 5,729,429 A | 3/1998 | Margaritis et al. |
| 5,876,008 A | 3/1999 | Sweere et al. |
| 5,954,642 A | 9/1999 | Johnson et al. |
| 6,079,993 A | 6/2000 | Laine |
| 6,223,393 B1 | 5/2001 | Knopf |
| 6,262,885 B1 | 7/2001 | Emma et al. |
| 6,381,125 B1 | 4/2002 | Mizoguchi et al. |
| 6,503,167 B1 | 1/2003 | Sturm |
| 6,505,382 B1 | 1/2003 | Lam et al. |
| 6,530,123 B1 | 3/2003 | Wahlstedt |
| 6,730,867 B2 | 5/2004 | Hyp |
| 6,766,180 B2 | 7/2004 | Doraiswamy et al. |
| 6,816,364 B2 | 11/2004 | Helot et al. |
| 6,822,857 B2 | 11/2004 | Jung et al. |
| 6,871,384 B2 | 3/2005 | Novin et al. |
| 7,043,797 B2 | 5/2006 | Cau |
| 7,054,147 B2 | 5/2006 | Maatta et al. |
| 7,145,768 B2 | 12/2006 | Hillman et al. |
| 7,289,315 B2 | 10/2007 | Hillman et al. |
| 7,301,759 B2 | 11/2007 | Hsiung |
| 7,461,433 B2 | 12/2008 | Pan et al. |
| 7,478,786 B2 | 1/2009 | Copeland |
| 7,506,853 B2 | 3/2009 | Sweere et al. |
| 7,643,275 B2 | 1/2010 | Williams et al. |
| 7,654,755 B2 | 2/2010 | Orf et al. |
| 7,694,919 B2 | 4/2010 | Lee |
| 7,766,288 B2 | 8/2010 | Kim et al. |
| 7,886,903 B1 | 2/2011 | Wurzelbacher, Jr. et al. |
| 8,011,623 B2 | 9/2011 | Hwang et al. |
| 8,035,957 B2 | 10/2011 | Jung |
| 8,075,128 B2 | 12/2011 | Park et al. |
| 8,104,142 B2 | 1/2012 | Lowry et al. |
| 8,230,553 B2 | 7/2012 | Degner et al. |
| 8,230,992 B2 | 7/2012 | Law et al. |
| 8,259,437 B2 | 9/2012 | Vesely |
| 8,310,468 B2 | 11/2012 | Martin |
| 8,400,767 B2 | 3/2013 | Yeon et al. |
| 8,505,169 B2 | 8/2013 | Wood et al. |
| 8,534,635 B2 | 9/2013 | Yang et al. |
| 8,537,533 B2 | 9/2013 | Sung |
| 8,549,710 B2 | 10/2013 | Novin |
| 8,608,221 B1 | 12/2013 | Krajenke et al. |
| 8,672,277 B2 | 3/2014 | Hsu |
| 8,724,306 B2 | 5/2014 | Ashcraft et al. |
| 8,769,772 B2 | 7/2014 | Griffin et al. |
| 8,787,016 B2 | 7/2014 | Rothkopf et al. |
| 8,811,005 B2 | 8/2014 | Casebolt et al. |
| 8,888,062 B2 | 11/2014 | Novin |
| 8,897,033 B2 | 11/2014 | Slipy et al. |
| 8,922,995 B2 | 12/2014 | Su |
| 8,925,153 B1 | 1/2015 | McGrath |
| 9,004,436 B2 | 4/2015 | Chen |
| 9,010,822 B2 | 4/2015 | Rasmussen et al. |
| 9,013,865 B2 | 4/2015 | Chen et al. |
| 9,064,431 B2 | 6/2015 | Ahn et al. |
| 9,072,179 B2 | 6/2015 | Su |
| 9,095,253 B2 | 8/2015 | Hinman et al. |
| 9,104,372 B2 | 8/2015 | Frenael |
| 9,155,235 B2 | 10/2015 | Lindblad et al. |
| 9,291,299 B2 | 3/2016 | Richard et al. |
| 9,448,583 B1 | 9/2016 | Lee et al. |
| 9,936,593 B2 | 4/2018 | Deily et al. |
| 9,946,309 B2 | 4/2018 | Hewett et al. |
| 2003/0223188 A1 | 12/2003 | Ha et al. |
| 2004/0021051 A1 | 2/2004 | Chiu |
| 2004/0057197 A1 | 3/2004 | Hill et al. |
| 2004/0066614 A1 | 4/2004 | Hong |
| 2004/0127266 A1 | 7/2004 | Aagaard et al. |
| 2004/0216273 A1 | 11/2004 | Kang et al. |
| 2005/0088808 A1 | 4/2005 | Michaux et al. |
| 2005/0108854 A1 | 5/2005 | Lee et al. |
| 2005/0128695 A1 | 6/2005 | Han |
| 2005/0247832 A1 | 11/2005 | Cho et al. |
| 2005/0254203 A1 | 11/2005 | Choi et al. |
| 2006/0032998 A1* | 2/2006 | Depay ............... F16M 11/10 248/291.1 |
| 2006/0039104 A1 | 2/2006 | Wang et al. |
| 2006/0133016 A1* | 6/2006 | North ............... F16M 11/10 361/679.22 |
| 2006/0176655 A1 | 8/2006 | Hillman et al. |
| 2007/0028419 A1 | 2/2007 | Lu et al. |
| 2007/0047186 A1 | 3/2007 | Jang |
| 2007/0058329 A1 | 3/2007 | Ledbetter et al. |
| 2007/0086155 A1 | 4/2007 | Chen et al. |
| 2007/0151079 A1 | 7/2007 | Lu et al. |
| 2007/0152125 A1 | 7/2007 | Lee |
| 2007/0230095 A1 | 10/2007 | Wu |
| 2008/0036925 A1* | 2/2008 | Hsiao ............... B60R 11/0235 348/837 |
| 2008/0068494 A1 | 3/2008 | Kim |
| 2008/0094792 A1 | 4/2008 | Chen et al. |
| 2008/0122736 A1 | 5/2008 | Ronzani et al. |
| 2009/0166501 A1 | 7/2009 | Wang et al. |
| 2010/0059648 A1* | 3/2010 | Zhang ............... F16M 11/105 248/371 |
| 2010/0084522 A1 | 4/2010 | Zhou et al. |
| 2010/0124009 A1 | 5/2010 | Jiang et al. |
| 2011/0006175 A1 | 1/2011 | Gwag |
| 2011/0051437 A1 | 3/2011 | Ng et al. |
| 2011/0062304 A1 | 3/2011 | Hsieh et al. |
| 2011/0127392 A1* | 6/2011 | Carter ............... B60R 11/02 248/121 |
| 2011/0286171 A1 | 11/2011 | Franz et al. |
| 2011/0299233 A1 | 12/2011 | Kim |
| 2012/0036679 A1 | 2/2012 | Chen |
| 2012/0091298 A1 | 4/2012 | Huang |
| 2012/0262857 A1 | 4/2012 | Fukaya et al. |
| 2012/0102675 A1 | 5/2012 | Lee et al. |
| 2012/0328222 A1 | 12/2012 | Chen et al. |
| 2013/0009034 A1 | 1/2013 | Fallows |
| 2013/0010424 A1 | 1/2013 | Degner et al. |
| 2013/0021723 A1 | 1/2013 | Harper et al. |
| 2013/0044454 A1 | 2/2013 | Lin et al. |
| 2013/0112818 A1* | 5/2013 | Hsu ............... F16M 11/10 248/121 |
| 2013/0144446 A1 | 6/2013 | Rihn et al. |
| 2013/0271939 A1 | 10/2013 | Cheline et al. |
| 2014/0063750 A1 | 3/2014 | Mau et al. |
| 2014/0085798 A1 | 3/2014 | Myerchin |
| 2014/0159995 A1 | 6/2014 | Adams et al. |
| 2014/0215758 A1 | 8/2014 | Franklin et al. |
| 2014/0218854 A1 | 8/2014 | Onda |
| 2014/0268555 A1 | 9/2014 | Kurczewski |
| 2014/0298616 A1 | 10/2014 | Baer |
| 2014/0321041 A1 | 10/2014 | Hsu et al. |

(56) References Cited

U.S. PATENT DOCUMENTS

| | | | |
|---|---|---|---|
| 2014/0353453 A1 | 12/2014 | Quijano et al. | |
| 2014/0361134 A1* | 12/2014 | Chuang | F16M 11/2014 248/276.1 |
| 2015/0000435 A1 | 1/2015 | Zhang et al. | |
| 2015/0048230 A1 | 2/2015 | Satterfield | |
| 2015/0077915 A1 | 3/2015 | Saito | |
| 2015/0092335 A1 | 4/2015 | Patrick et al. | |
| 2015/0097092 A1 | 4/2015 | Fu et al. | |
| 2015/0121654 A1 | 5/2015 | Novin | |
| 2015/0185709 A1 | 7/2015 | Vroom et al. | |
| 2015/0265048 A1 | 9/2015 | Lindblad | |
| 2015/0277506 A1 | 10/2015 | Cheah et al. | |
| 2015/0285233 A1 | 10/2015 | Theodore et al. | |
| 2015/0336480 A1 | 11/2015 | Szakelyhidi et al. | |
| 2015/0362692 A1 | 12/2015 | Lee et al. | |
| 2015/0362962 A1 | 12/2015 | Lee et al. | |
| 2016/0052533 A1 | 2/2016 | Wu et al. | |
| 2016/0161045 A1 | 6/2016 | Lee et al. | |
| 2017/0300082 A1 | 10/2017 | Park et al. | |
| 2017/0300083 A1 | 10/2017 | Park et al. | |
| 2017/0303413 A1 | 10/2017 | Park et al. | |
| 2017/0303415 A1 | 10/2017 | Deily et al. | |
| 2017/0357293 A1 | 12/2017 | Hewett et al. | |

FOREIGN PATENT DOCUMENTS

| | | |
|---|---|---|
| CN | 101452747 A | 6/2009 |
| CN | 100520514 C | 7/2009 |
| CN | 201273438 Y | 7/2009 |
| CN | 101713487 A | 5/2010 |
| CN | 101737595 A | 6/2010 |
| CN | 201651679 U | 11/2010 |
| CN | 201651697 U | 11/2010 |
| CN | 202252691 U | 5/2012 |
| CN | 103576753 A | 2/2014 |
| CN | 103582854 A | 2/2014 |
| EP | 1344972 A2 | 9/2003 |
| EP | 1507387 A1 | 2/2005 |
| EP | 1526436 A2 | 4/2005 |
| TW | M430129 U1 | 5/2012 |
| TW | 201320742 A | 5/2013 |
| WO | 1998/016144 A1 | 4/1998 |
| WO | 2006/095987 A1 | 9/2006 |
| WO | 2015/016837 A1 | 2/2015 |
| WO | 2017/180537 A1 | 10/2017 |

OTHER PUBLICATIONS

Non-Final Office Action dated Jul. 13, 2017 from U.S. Appl. No. 15/099,441, 46 pages.
Notice of Allowance dated Aug. 11, 2017 from U.S. Appl. No. 15/179,383, 22 pages.
Corrected Notice of Allowability dated Jun. 20, 2017 from U.S. Appl. No. 15/099,238, 8 pages.
Corrected Notice of Allowability dated Jul. 13, 2017 from U.S. Appl. No. 15/099,238, 8 pages.
Response filed May 18, 2017 to the Non-Final Office Action dated Mar. 21, 2017 from U.S. Appl. No. 15/179,383, 11 pages.
Non-Final Office Action dated Mar. 21, 2017 from U.S. Appl. No. 15/179,383, 40 pages.
International Search Report and Written Opinion dated Jul. 7, 2017 from PCT Patent Application No. PCT/US2017/027080, 25 pages.
International Search Report and Written Opinion dated Jul. 18, 2017 from PCT Patent Application No. PCT/US2017/027081, 27 pages.
International Search Report and Written Opinion dated Jun. 8, 2017 from PCT Patent Application No. PCT/US2017/026872, 20 pages.
International Search Report and Written Opinion dated Jul. 18, 2017 from PCT Patent Application No. PCT/US2017/028240, 13 pages.
International Search Report and Written Opinion dated Jun. 30, 2017 from PCT Patent Application No. PCT/US2017/027082, 24 pages.
International Search Report and Written Opinion dated Jun. 30, 2017 from PCT Patent Application No. PCT/US2017/026874, 22 pages.
Response filed Oct. 9, 2017 to Non-Final Office Action dated Jul. 13, 2017 from U.S. Appl. No. 15/099,441, 9 pages.
Invitation to Pay Additional Fees and partial International Search Report dated Sep. 1, 2017 from PCT Patent Application No. PCT/US2017/035571, 13 pages.
Notice of Allowance dated Sep. 19, 2017 from U.S. Appl. No. 15/099,238, 20 pages.
"Are there any types of DC motors that self-lock themselves?", retrieved at <<http://electronics.stackexchange.com/questions/91916/are-there-any-types-of-dc-motors-that-self-lock-themselves>>, Nov. 26, 2013, 2 pages.
"Humanscale M8 Monitor Arm", retrieved at <<http://www.thehumansolution.com/humanscale-m8-monitor-arm-sds.html>>, on Apr. 12, 2012, 3 pages.
"Prepara iPrep Tablet Stand with Stylus", retrieved at <<http://www.rakuten.com/prod/prepara-iprep-tablet-stand-with-stylus-white/256971780.html>>, on Dec. 29, 2015, 3 pages.
"World's First "Ultra-Compact One-Way Clutch" Announced", retrieved at <<http://www.ntn.co.jp/english/news/new_products/news20020315.html#add1>>, Mar. 15, 2002, 2 pages.
Korane, Kenneth, "Options for Designing the Best Hinge", retrieved at <<http://machinedesign.com/news/options-designing-best-hinge>>, Jul. 19, 2012, 4 pages.
Lenovo Yoga 3 Pro, captured by the Internet archive on Aug. 11, 2015 at <<http://shop.lenovo.com/us/en/laptops/lenovo/yoga-laptop-series/yoga-3-pro-laptop/>>, 2 pages.
Westover, Brian, "HP Spectre x360 13t (13-4003)", captured by the Internet archive on Jul. 21, 2015 at <<http://in.pcmag.com/hp-spectre-x360-13t-13/4003/40964/review/hp-spectre-x360-13t-13/4003>>, 6 pages.
U.S. Appl. No. 62/357,880 titled "Hinge Clutch" filed Jul. 1, 2016 by Inventor Marlo E. Castillo, 17 pages.
Subramanian, et al., "Assembly Analysis of Interference Fits in Elastic Materials", In Proceedings of 5th IFIP WG 5.5 International Precision Assembly Seminar, IFIP Advances in Information and Communication Technology, Feb. 14, 2010, 9 pages.
"Grass Products", Published on: May 30, 2012; Available at: <<<http://www.grass.at/uebersicht-nexis-click-on.html?L=1>>>, 1 page.
Jones, Christie, "Options for Designing the Best Hinge", Published on: Jul. 19, 2012; Available at: <<<http://machinedesign.com/news/options-designing-best-hinge>>>; 3 pages.
"Counterbalance Torsion Spring System", Retrieved from <<http://www.cbal.com/uploads/3/3/6/7/3367458/brochure_cbal_2013.pdf>>, Retrieved Date: May 20, 2016, 02 Pages.
"Non-Final Office Action Issued in U.S. Appl. No. 15/099,501", dated Apr. 13, 2018, 8 Pages.
"Final Office Action Issued in U.S. Appl. No. 15/099,379", dated Feb. 26, 2019, 22 Pages.
"Non Final Office Action Issued in U.S. Appl. No. 15/099,379", dated Sep. 17, 2019, 23 Pages.
Non-Final Office Action dated Nov. 17, 2017 from U.S. Appl. No. 15/099,501, 60 pages.
International Search Report and Written Opinion dated Dec. 6, 2017 from PCT Patent Application No. PCT/US2017/035571, 19 pages.
"Office Action Issued in European Patent Application No. 17730009.2", dated Jun. 29, 2020, 10 Pages.
"Office Action Issued in European Patent Application No. 17719445.3", dated Jul. 16, 2020, 4 Pages.
"Office Action Issued in European Patent Application No. 17719118.6", dated Jul. 16, 2020, 11 Pages.
"Office Action Issued in European Patent Application No. 17719116.0", dated Jul. 6, 2020, 5 Pages.
"Notice of Allowance Issued in U.S. Appl. No. 15/099,379", dated Sep. 24, 2020, 10 Pages.
"First Office Action and Search Report Issued in Chinese Patent Application No. 201780023850.5", dated Jan. 6, 2021, 15 Pages.
"First Office Action and Search Report Issued in Chinese Patent Application No. 201780023816.8", dated Jan. 4, 2021, 21 Pages.

(56) References Cited

OTHER PUBLICATIONS

"Office Action and Search Report Issued in Chinese Patent Application No. 201780023831.2", dated Jan. 8, 2021, 15 Pages.
"Office Action Issued in European Patent Application No. 17719446.1", dated Sep. 7, 2020, 7 Pages.
"Office Action Issued in European Patent Application No. 17719447.9", dated Sep. 7, 2020, 6 Pages.
"Office Action and Search Report Issued in China Patent Application No. 201780023848.8", dated Feb. 5, 2021, 14 Pages.
"Office Action Issued in European Patent Application No. 17719116.0", dated Mar. 5, 2021, 9 Pages.
"Office Action Issued in European Patent Application No. 17719118.6", dated Mar. 15, 2021, 10 Pages.
"Office Action Issued in European Patent Application No. 17719445.3", dated Mar. 15, 2021, 10 Pages.

\* cited by examiner

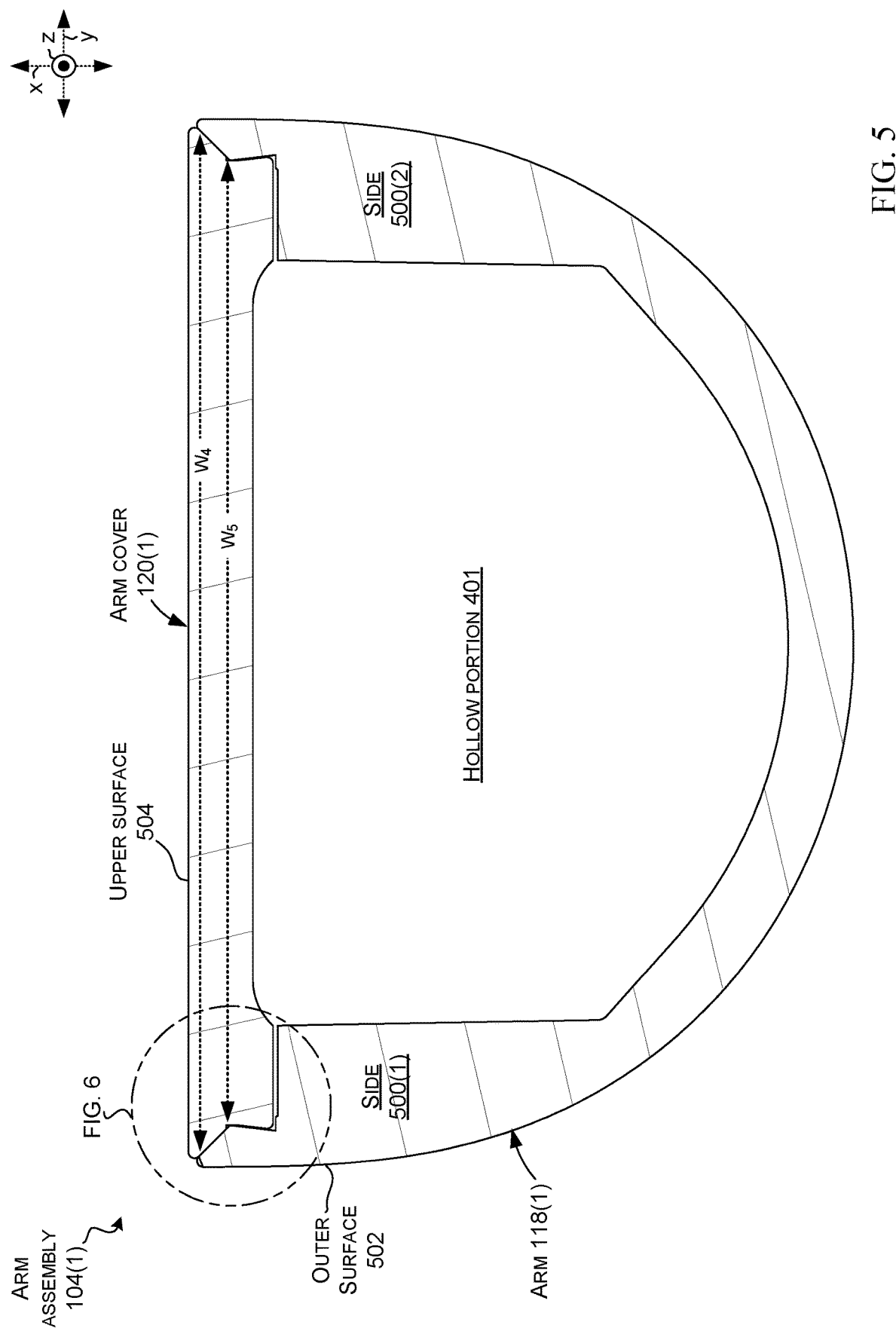

STRUCTURAL DEVICE COVER

BACKGROUND

The description relates to devices and specifically to a structural cover that can be used on a hinge arm of the devices.

BRIEF DESCRIPTION OF THE DRAWINGS

The accompanying drawings illustrate implementations of the concepts conveyed in the present document. Features of the illustrated implementations can be more readily understood by reference to the following description taken in conjunction with the accompanying drawings. Like reference numbers in the various drawings are used wherever feasible to indicate like elements. Further, the left-most numeral of each reference number conveys the FIG. and associated discussion where the reference number is first introduced.

FIGS. 5 and 6 are sectional views of portions of example devices in accordance with the present concepts.

DESCRIPTION

Figure 1A:
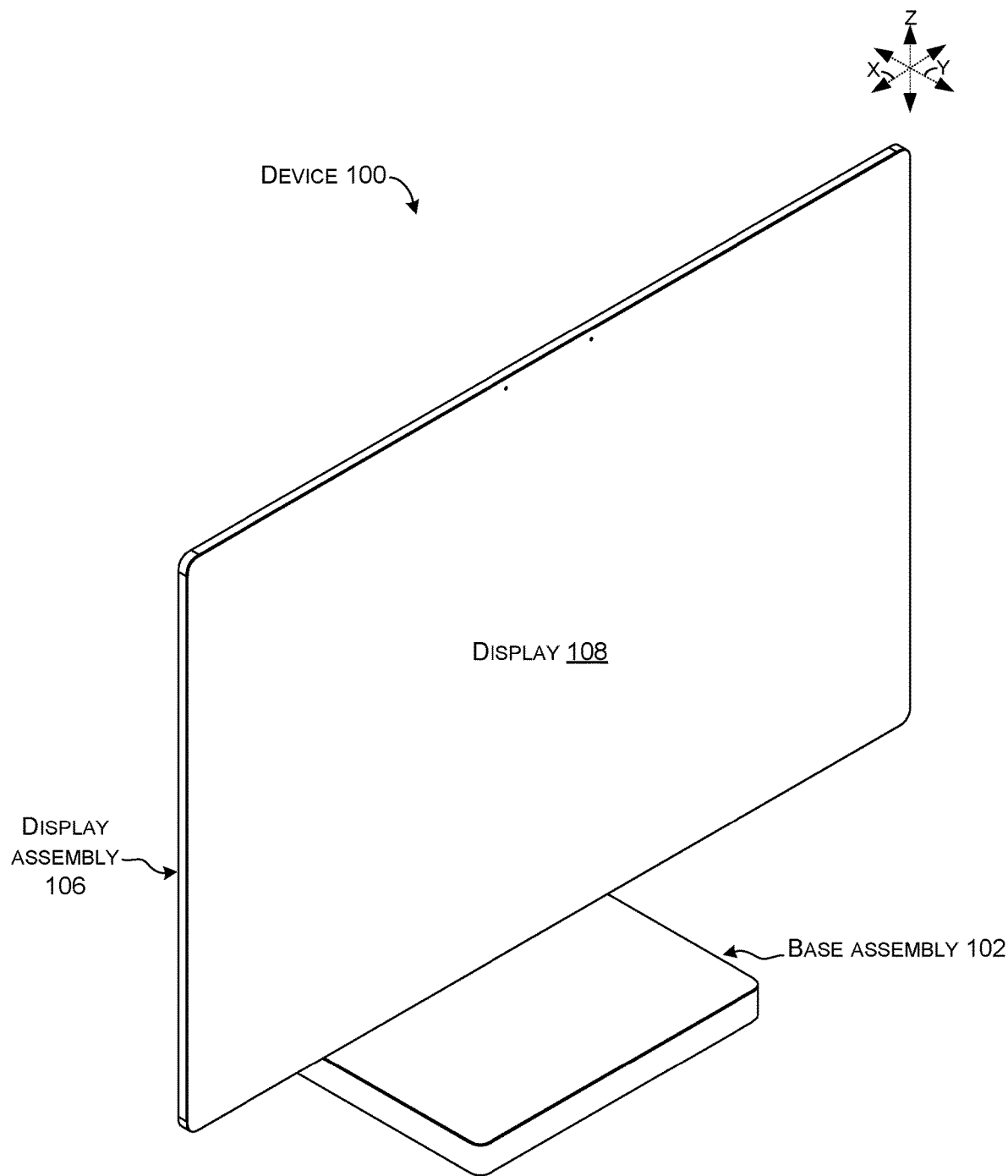
FIGS. 1A, 1B, and 7 are perspective views of an example device in accordance with the present concepts.
Figure 1B:
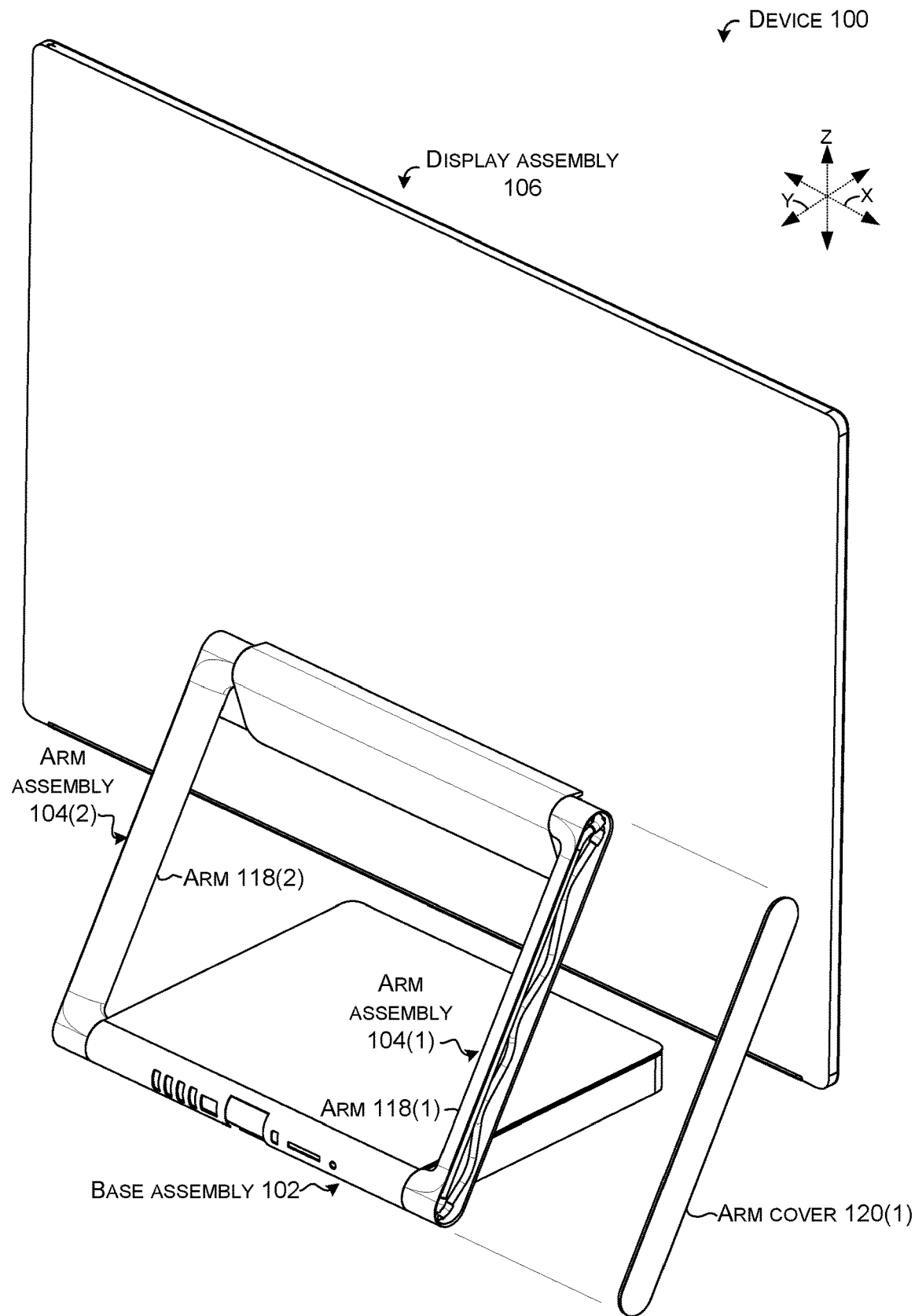
Figure 1C:
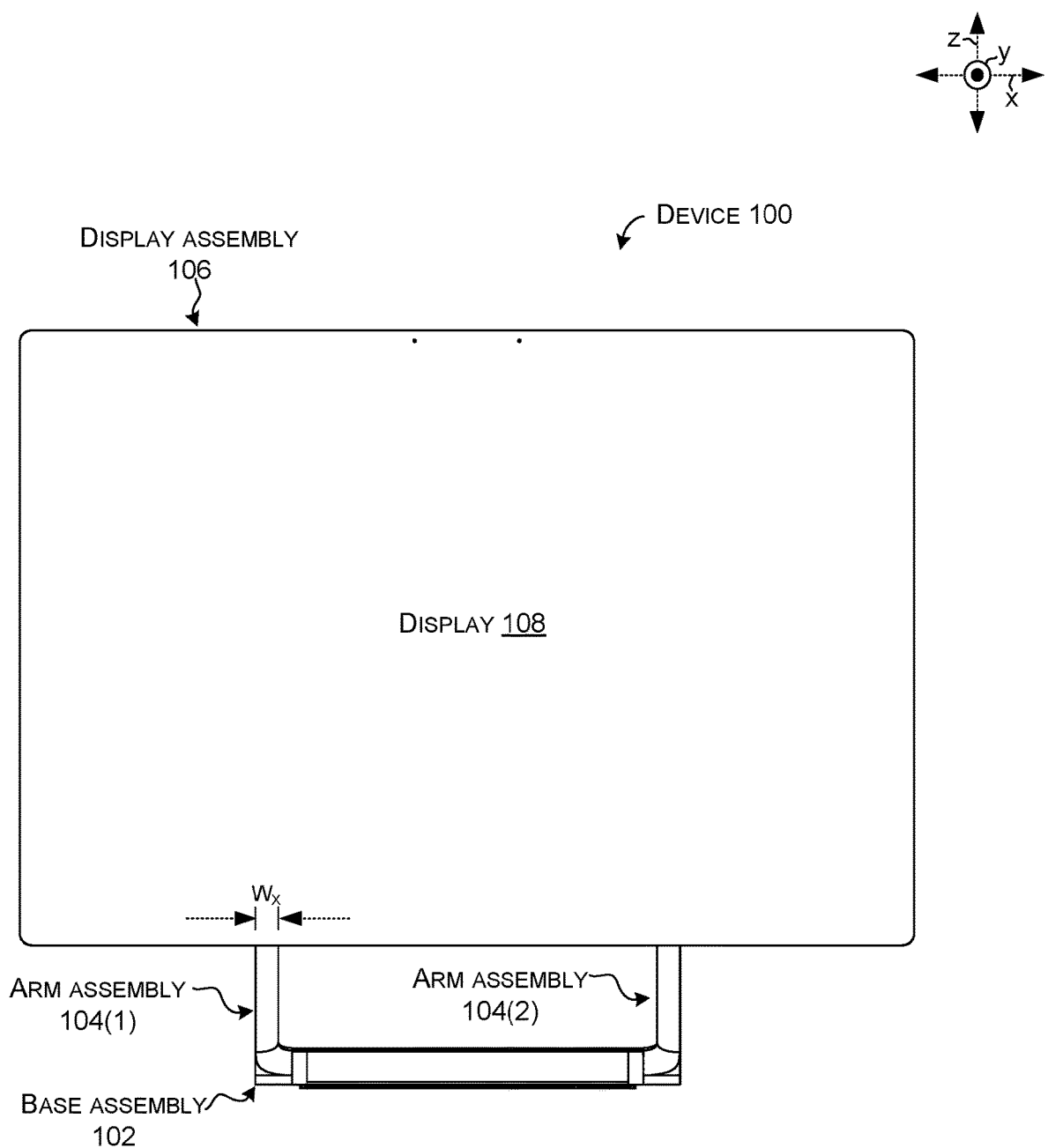
FIGS. 1C, 1D, 2, and 3 are elevational views of an example device in accordance with the present concepts.

The present concepts relate to devices, such as computing devices that include an adjustable display and a processor that controls the display. The display can be a touch display that can be adjusted to multiple different physical positions via an arm assembly that functions as a hinge. The arm assembly can include an arm and a removable arm cover that contributes structurally to the arm.

Introductory FIGS. 1A-1D collectively show an example device 100 that can include a base assembly 102, an arm assembly 104, and a display assembly 106 that can include a display 108 secured to a display mount 109. The base assembly 102 can include a base module 110 and a housing 112 that can contain various electronic components 114, such as a processor 116 for controlling the display 108. The controlling can be achieved wirelessly or via conductors (not shown) that travel from the base assembly 102 to the display assembly 106 via the arm assembly 104. Note that there are actually two arm assemblies 104(1) and 104(2) and two base modules 110(1) and 110(2) (e.g., right and left) in some implementations, but these elements can generally be discussed interchangeably or generically in the description below. As a result, the suffix (e.g., "(1)" or "(2)") may not be used strictly in the following description and drawings. Further, other implementations may omit the electronic components 114 and/or position the electronic components at different locations in the device. For instance, in an alternative configuration, some or all of the electronic components can be located in the display assembly 106.

The arm assembly 104 can include a hinge arm (e.g., 'arm') 118 and an arm cover 120. The arm cover can be removably secured to the arm in a manner that can create a seamless appearance and can contribute structurally to the arm. These aspects can also allow the arm to be narrower relative to the x and y reference directions (e.g., represented by width $w_x$ on FIG. 1C and $w_y$ on FIG. 1D) while better satisfying structural parameters than would be the case with other types of arm covers.

The arm assembly 104 can rotatably couple the display assembly 106 to the base assembly 102 by providing upper and lower axes of rotation 122(1) and 122(2). Specifically, rotation around the lower axis of rotation 122(2) can define an angle alpha or 'α' between the hinge arm 118 and the base assembly 102 (e.g., between the hinge arm and a horizontal surface 124 upon which the device is positioned). Rotation around hinge axes of rotation 122(1) and 122(2) can define an angle beta or 'β' between the display assembly 106 (e.g., display 108) and the horizontal surface 124.

Figure 2:
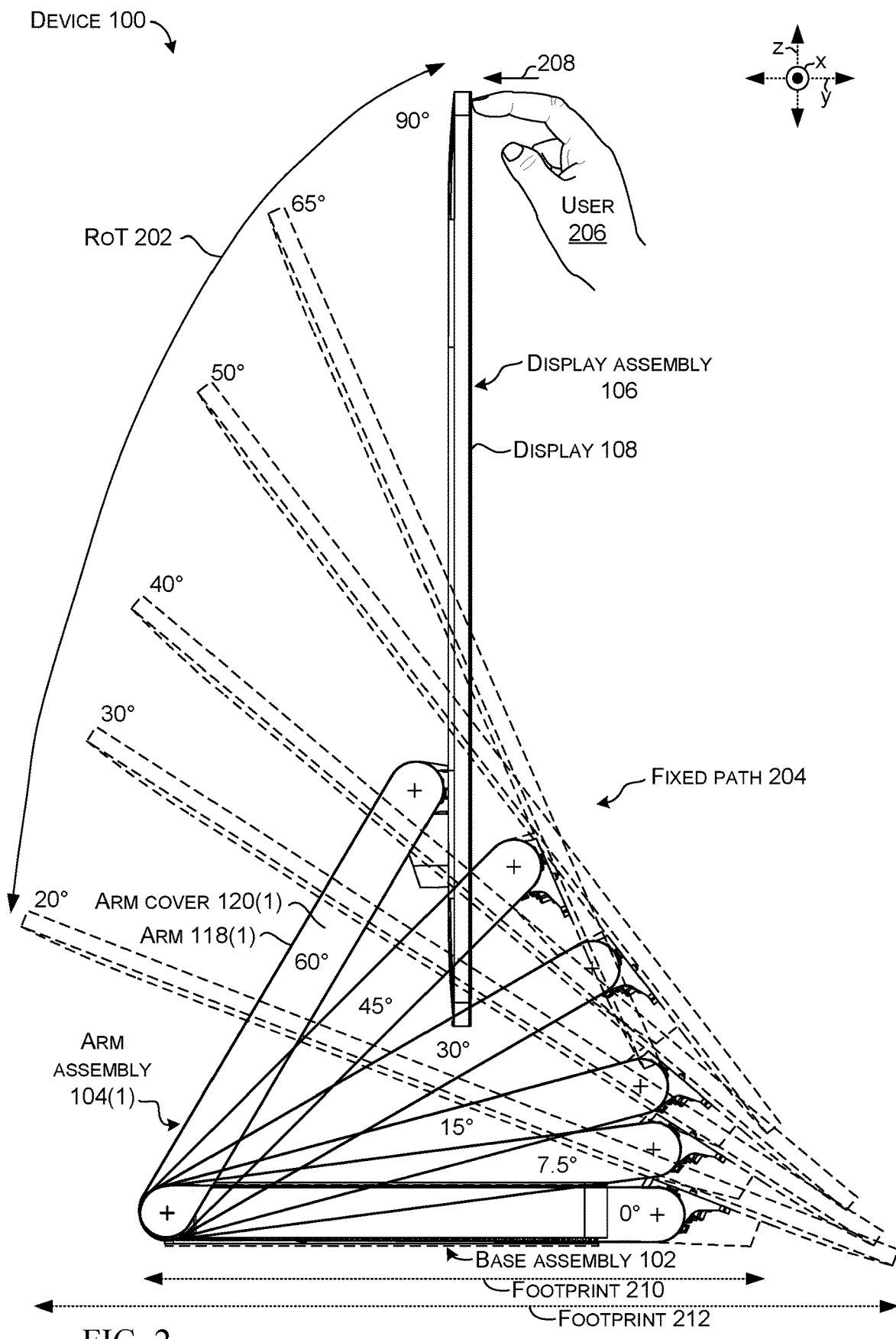

FIG. 2 shows the device 100 through a range of travel 202 along a fixed non-linear motion path 204 (e.g., with a single degree of freedom such that an individual angle of the hinge arm 118(1) translates to a specific individual angle of the display 108). For instance, in this example a 60 degree alpha angle is translated into a 90 degree beta angle (e.g. work mode), a 45 degree α angle is translated into a 65 degree beta angle, a 30 degree alpha angle is translated into a 50 degree beta angle, a 15 degree alpha angle is translated into a 40 degree beta angle, a 7.5 degree alpha angle is translated into a 30 degree beta angle, and a zero degree alpha angle is translated into a 20 degree beta angle (draw mode), among others. Further, while the device can maintain an orientation during use, such as when a user 206 touches a touch sensitive version of the display, the user can almost effortlessly rotate the display 108 by supplying a small force 208 to the display assembly 106 or the arm assembly 104. From one perspective the device 100 can provide a nearly weightless experience to the adjusting user (e.g., the weight of the display assembly 106 can be effectively balanced (e.g., counter-balanced) throughout the range of travel 202). Stated another way, the device 100 can provide nearly net-zero torque throughout the range of travel 202. The weightlessness can be achieved by counter-balancing the weight of the display assembly 106 and the arm assembly 104 that creates a rotational force (e.g., torque) around the upper and lower axes of rotation 122(1) and 122(2). However, this rotational force can change through the range of travel 202 as the alpha and beta angles change.

Some of the present implementations can achieve this weightless experience with a relatively small footprint 210. For instance, in some implementations, no portion of the device extends beyond a largest footprint 212 defined by the display (e.g., in this case footprint 212 of the display assembly 106 defined when the alpha angle is zero and the beta angle is 20 degrees compared to footprint 210 of a remainder of the device). The present implementations can be robust to allow the user to apply high touch forces in both work and draw modes and allow the end user to lean on the device 100 without damaging it. Toward this end, the arm cover 120 can contribute structural integrity to the arm 118 rather than just acting as a superficial cover. Further, while arm assembly 104 is employed in the single degree of freedom solution illustrated in FIGS. 1A-2, the arm assembly can be employed in other device configurations. For instance, the arm assembly can be employed in a device offering two degrees of freedom between the base assembly and the display. Other implementations can be employed outside of the arm assembly context illustrated here for purposes of explanation.

Figure 3:
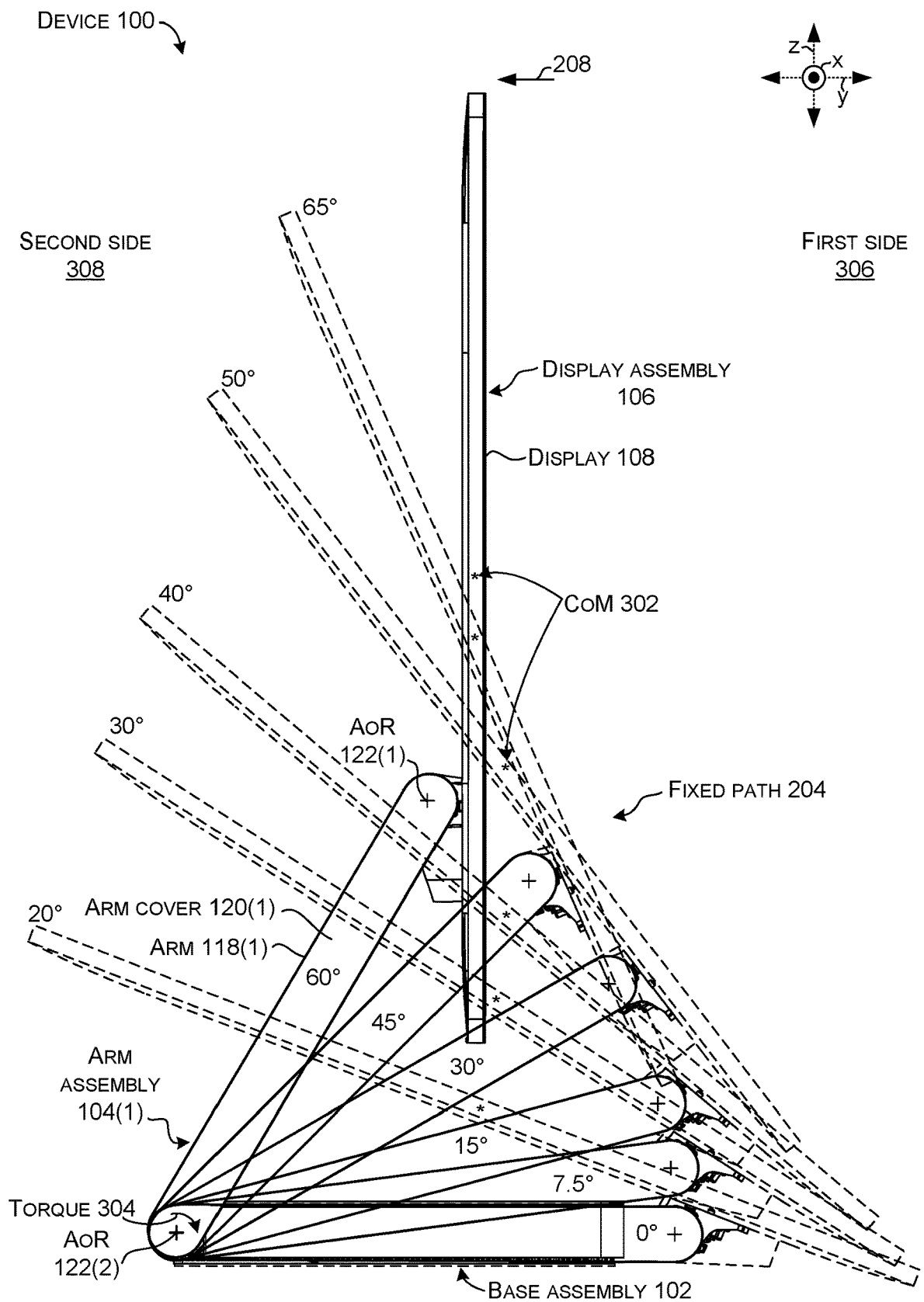

FIG. 3 is similar to FIG. 2, and adds the center of mass 302 of the arm assembly 104 and the display assembly 106 at various alpha angles. (The center of mass 302 is shown as a '*'). The mass of the display assembly can create torque 304 on the lower axis of rotation 122(2). Note that the mass of the display assembly as well as the arm assembly itself can contribute to the force and torque experienced by the arm assembly. Thus, an arm assembly that offers a high strength to mass ratio can contribute to the integrity of the arm assembly as well as provide an attractive design that visually emphasizes the display and reduces/minimizes the visual impact of the arm assembly. As will be described in more detail below relative to FIGS. 5 and 6, example arm assembly implementations can employ a relatively svelte arm that is structurally strengthened by the arm cover.

In relation to the center of mass 302, note that in this implementation, in the 60 degree alpha angle the center of mass is on a first side (e.g., front side) 306 of the display assembly 106. At approximately 50-55 degrees, the center of mass transitions to a second opposite side (e.g., back side) 308 of the display assembly. This transition can be one of several factors that cause torque 304 imparted on the lower axis of rotation 122(2) and/or the upper axis of rotation 122(1) to be non-linear. The torque can be generated as a result of forces experienced by the arm assembly 104. As mentioned above, the present arm 118 and arm cover 120 implementations can provide an arm assembly that is structurally stronger than an arm with a superficial arm covering and/or can allow the use of a smaller arm than would be the case with a superficial arm cover.

Figure 1D:
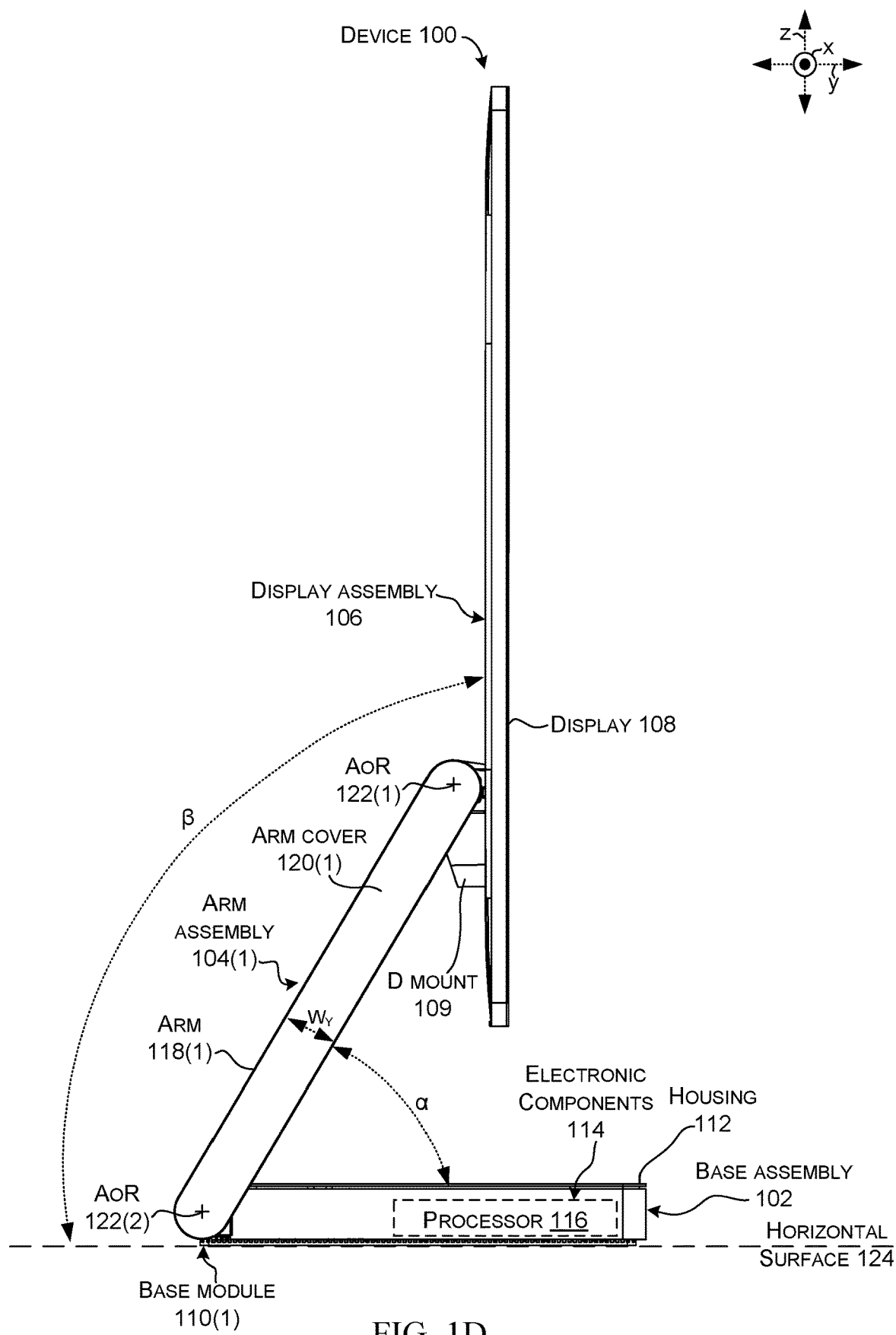
Figure 4A:
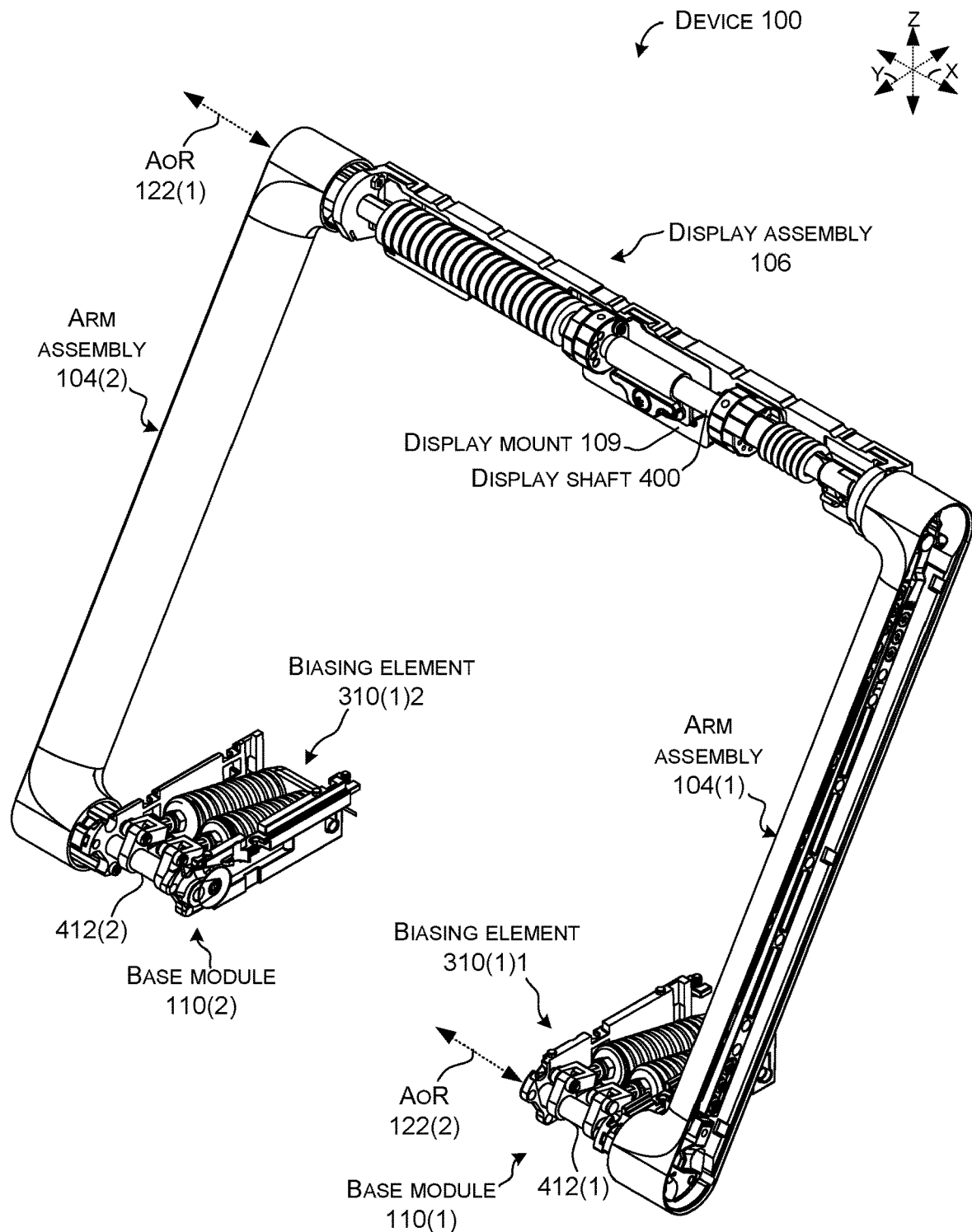
FIGS. 4A and 4B are perspective views of portions of example devices in accordance with the present concepts.
Figure 4B:
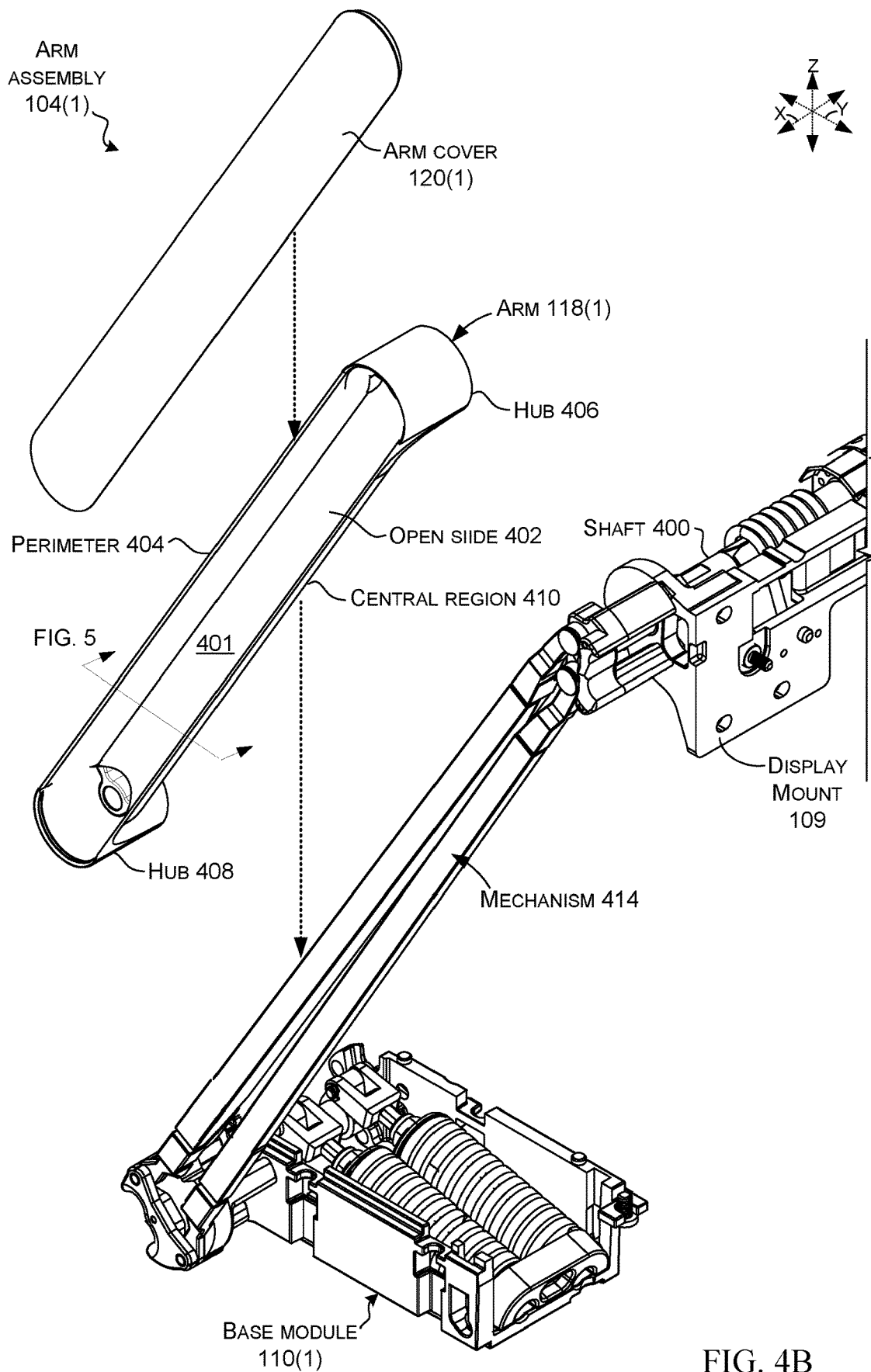

FIGS. 4A and 4B collectively show the device 100 without the base assembly's housing 112 and without the display 108 (contrast with FIG. 1D). The display assembly 106 can include a display shaft 400 that can define upper axis of rotation 122(1) and display mount 109 can rotate around the display shaft.

Arm 118(1) can be hollow (e.g., hollow portion 401) and can have an open side 402 defined by a perimeter 404 that can be configured to receive arm cover 120(1). The arm can include upper and lower hubs 406 and 408 extending beyond a central region 410. The upper hub 406 can be secured to the display shaft 400 and the lower hub 408 can be secured to a base shaft 412 that defines the lower axis of rotation 122(2) of the base module 110. The hollow arm can allow mechanisms 414 to be positioned in the arm. The mechanism 414 can solely or in combination with arm 118(1) translate rotation between the base shaft 412 and the display shaft 400. The hollow arm can alternatively or additionally allow conductors (not shown) to run from the base assembly to the display through the arm without being visible to the user. Thus, the (hollow) arm can protect the conductors from damage and create a visually appealing device.

Figure 6:
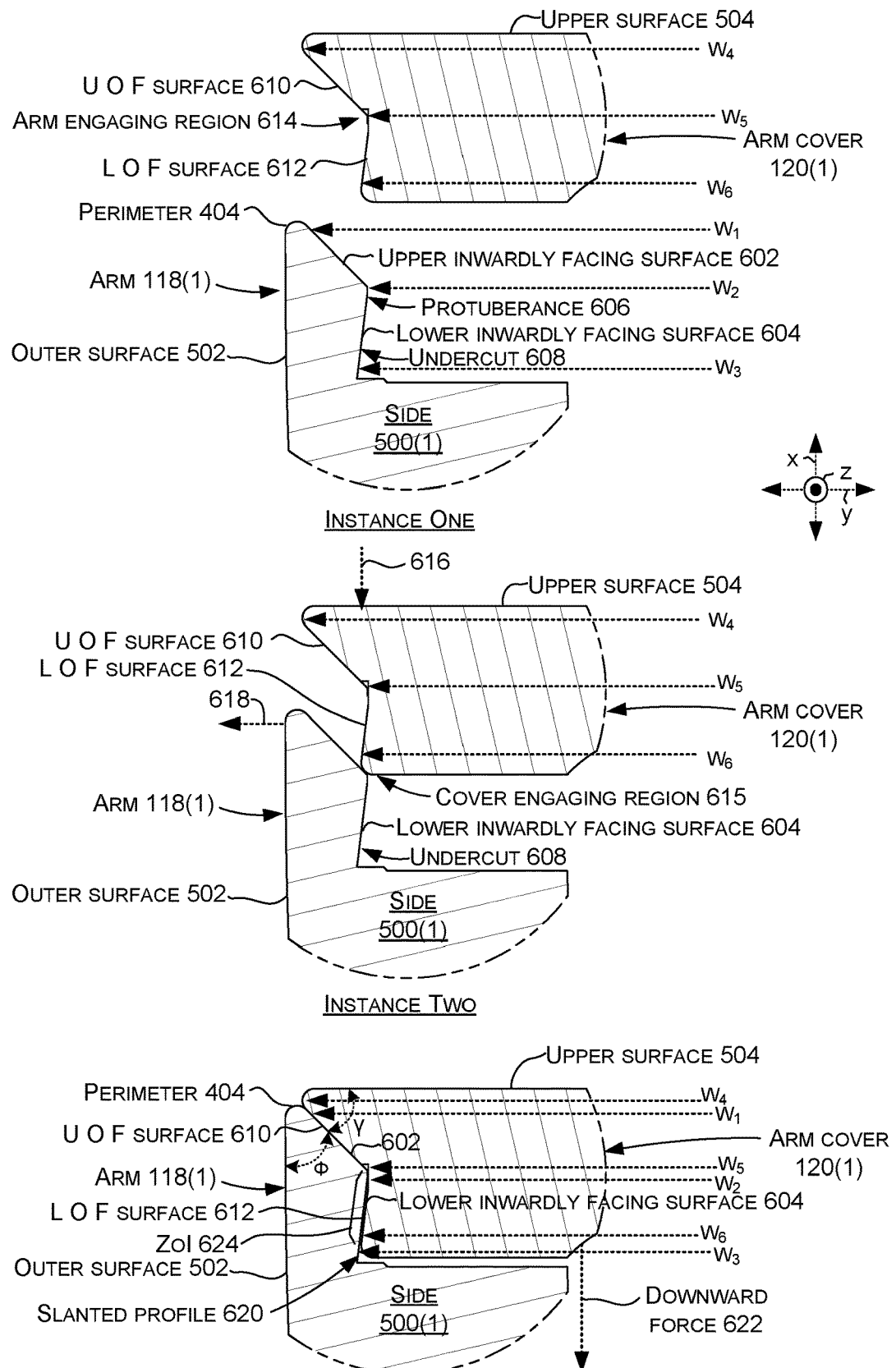

FIGS. 5 and 6 collectively show additional features of arm assembly 104(1). FIG. 5 shows a cross-section as indicated in FIG. 4B through arm 118(1) with arm cover 120(1) in place. Arm 118(1) and the arm cover 120(1) can collectively define hollow portion 401. In this case, the arm can include two generally opposing sides 500(1) and 500(2). The arm can define an outer surface 502 of the arm assembly and the arm cover can define an upper surface 504. Other implementations are contemplated with other profiles. For instance, the sides can be curved or the sides can be straight, among other examples.

FIG. 6 shows an enlarged region of the arm assembly 104(1) as indicated in FIG. 5 showing side 500(1) of the arm 118(1) and a proximate portion of the arm cover 120(1). In this implementation, arm 118(1) can define an upper inwardly facing surface 602 and a lower inwardly facing surface 604. Viewed from another perspective, the arm can define a protuberance 606 that protrudes inwardly from the perimeter 404 and an undercut 608 that is below the protuberance. The arm can define a width $W_1$ at the perimeter 404, a width $W_2$ at the protuberance 606 (e.g., farther from the perimeter) and a width $W_3$ at the undercut 608 (e.g., farthest from the perimeter). In this example, width $W_3$ can be greater than width $W_2$ and less than width $W_1$. The function provided by these widths is described below.

In this implementation, arm cover 120(1) can define an upper outwardly facing surface 610 and a lower outwardly facing surface 612. Viewed another way, the arm cover can include an arm engaging region 614 that interacts with a cover engaging region 615 of the arm 118(1). The arm cover can define a width $W_4$ at the perimeter 404 (e.g., proximate to upper surface 504), a width $W_5$ at an intersection of the upper outwardly facing surface 610 and the lower outwardly facing surface 612, and a width $W_6$ at an end of the lower outwardly facing surface that is distal to the upper surface 504 relative to both width $W_4$ and width $W_5$. Note that to provide full context, widths $W_4$ and $W_5$ are shown on FIG. 5, while widths $W_1$-$W_3$ and $W_6$ are not shown to avoid clutter on the drawing page that may obscure features of the arm assembly.

FIG. 6 shows three instances of the arm 118(1) and arm cover 120(1). Instance One shows an unassembled scenario where the arm cover 120(1) is positioned above the arm 118(1).

Instance Two shows an assembly scenario where the arm cover 120(1) is lowered down (e.g., parallel to the x-reference direction) and contacts arm 118(1). At this point, width $W_6$ of the arm cover is wider that width $W_2$ of the arm thereby impeding further downward movement of the arm cover. Downward force 616 can be applied to the arm cover. This downward force 616 can temporarily deflect the arm outwardly as indicated at 618 (e.g., force side 500(1) and side 500(2) (FIG. 5) away from one another. The deflection can allow the wider lower portion of the arm cover represented by width $W_6$ to pass.

Instance Three shows the arm cover 120(1) installed on the arm 118(1). At this point, deflection 618 of the arm has ceased (or is reduced) and the arm has returned to (essentially) its original (e.g., non-deflected) position. In this case, a slanted profile 620 of the lower inward facing surface 604 and the lower outwardly facing surface 612 (e.g., sloping back toward the outer surface 502 with increasing distance from the upper surface 504) can generate a downward force 622 of the arm cover 120(1) relative to the arm 118(1). Viewed from another perspective, the downward force can be created by a zone of interference 624 between the lower inwardly facing surface 604 of the arm 118(1) and the lower outwardly facing surface 612 of the arm cover 120(1). The downward force 622 can maintain contact between upper outwardly facing surface 610 and the upper inwardly facing surface 602. This contact can assure a tight joint of the arm cover 120(1) and the arm 118(1) at the perimeter. In this case, the joint can be formed on an edge between the outer surface 502 and the upper surface 504. Locating the joint at the edge can make the joint less noticeable (e.g., harder to detect) for the user and thereby can be more aesthetically pleasing than other configurations.

In this implementation the outer surface 502 and the upper surface 504 are perpendicular (e.g., 90 degree angle) to one another, but in other implementations, the outer surface and the upper surface could be at greater than or less than 90 degrees (e.g., oblique angle relative to one another). Further, in this instance, the upper inner facing surface 602 forms an angle phi 'φ' of 45 degrees relative to outer surface 502. Similarly, upper outer facing surface 610 forms an angle gamma 'γ' of 45 degrees relative to upper surface 504. These values can contribute to maintaining contact between the upper outwardly facing surface 610 and the upper inner facing surface 602 and to maintaining a concise edge at perimeter 404. Other implementations can employ other angles. For instance, the phi angle could be 50 degrees and the gamma angle 40 degrees, for example.

In some implementations, width $W_5$ of the arm cover at the arm engagement region 614 can be equal to or slightly greater than width $W_2$ of the arm protuberance 606. As such, the arm cover is held tightly between the two sides of the arm and thereby acts as a structural member that ties the two sides 500(1) and 500(2) (FIG. 5) together and prevents independent movement of the sides. Thus, from one perspective, the arm cover can effectively transform the arm from a 'U channel' structural member to a 'tube' structural member with associated structural enhancement and resistance to deformation. This can be evidence from FIG. 7.

Figure 7:
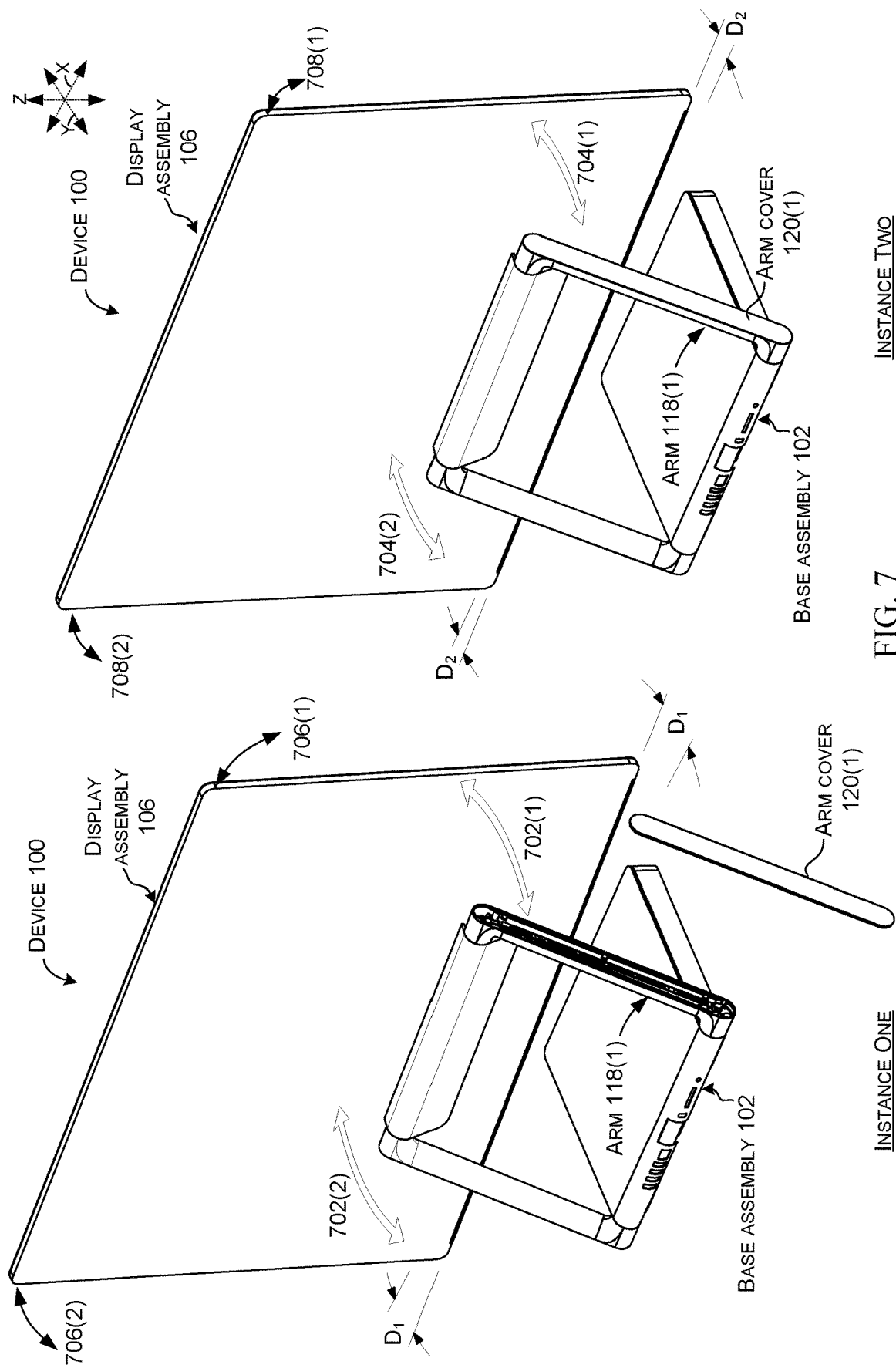

FIG. 7 shows device 100 at Instance One with arm cover 120(1) removed and Instance Two shows the arm cover installed on the arm 118(1). Note that in Instance One and Instance Two equivalent forces are applied to the display assembly 106. In Instance One, lacking the arm cover 120(1), the result is more movement or displacement $D_1$ of the display assembly relative to the base assembly as indicated by arrows 702. In contrast, in Instance Two, with the arm cover 120(1) in place to enhance the structural integrity of the arm 118(1), less relative movement $D_2$ occurs as indicated by arrows 704. Alternatively or additionally to the rotation described relative to arrows 702 and 704, the display can be exposed to torsional forces (e.g., rotational forces parallel to the xz reference plane (or around the y reference axis) as illustrated by arrows 706 and 708. The enhanced structural integrity provided by the assembled arm/arm cover structure can reduce torsional deformation for a given rotation force compared to the arm by itself.

Despite enhancing the structural properties of the arm 118, in some implementations the arm cover 120 can be readily removed, such as for servicing components within the arm, and then re-installed. For instance, a small hole may be positioned at an inconspicuous location on the hinge arm. For instance, in the view of FIG. 5, the hole (though not shown) could be placed opposite the arm cover (e.g., in the 6 o'clock' position). The hole can be vertical (e.g., parallel with the x-reference direction). The hole can allow a tool to be inserted through the hole and through the hollow portion 401 until the tool contacts the arm cover 120(1). Force can be applied to the tool to force the arm cover 120(1) upward off of the arm 118(1).

Thus, in some implementations, the arm cover can function to structurally enhance the arm and accomplish this functionality in an aesthetically pleasing manner while being removable and re-installable.

The above identified components can be made from various structural materials, such as metals, polymers, and/or composites. The components can be formed utilizing various techniques, such as 3D printing, machining, metal injection molding, etc.

Additional Examples

Various device examples are described above. Additional examples are described below. One example includes a device comprising a base assembly that is configured to define a lower axis of rotation and further comprising a display assembly including a display that is configured to rotate around an upper axis of rotation. The device further comprises an arm assembly extending from the base assembly at the lower axis of rotation to the display assembly at the upper axis of rotation. The arm assembly comprising a hollow arm and an arm cover, where the hollow arm includes an open side for receiving the arm cover at a cover engaging region. The cover engaging region defines a first width at the open side, a second width farther from the open side, and a third width that is farther from the open side than the first width and the second width, and where the third width is less than the first width and greater than the second width.

Another example can include any of the above and/or below examples where the arm defines an outer surface and upper and lower inwardly facing surfaces that are neither parallel nor perpendicular to the outer surface.

Another example can include any of the above and/or below examples where the first width is defined at an intersection of the outer surface and the upper inwardly facing surface.

Another example can include any of the above and/or below examples where the second width is defined at an intersection of the upper inwardly facing surface and the lower inwardly facing surface.

Another example can include any of the above and/or below examples where the third width is defined on the lower inwardly facing surface distal from the upper inwardly facing surface.

Another example can include any of the above and/or below examples where the arm cover defines an upper surface and an arm engaging region that includes upper and lower outwardly facing surfaces that are neither parallel nor perpendicular to the upper surface.

Another example can include any of the above and/or below examples where the upper and lower outwardly facing surfaces define an upper width, an intermediate width, and a lower width, and where the lower width is greater than the intermediate width but less than the upper width.

Another example can include any of the above and/or below examples where the upper width is defined at an intersection of the upper surface and the upper outwardly facing surface.

Another example can include any of the above and/or below examples where the intermediate width is defined at an intersection of the upper outwardly facing surface and the lower outwardly facing surface.

Another example can include any of the above and/or below examples where the lower width is defined on the lower outwardly facing surface distal from the upper outwardly facing surface.

Another example can include any of the above and/or below examples where contact between the lower inwardly facing surface and the lower outwardly facing surface creates a downward force on the arm cover.

Another example can include any of the above and/or below examples where the downward force keeps the upper outwardly facing surface in contact with the upper inwardly facing surface.

Another example can include any of the above and/or below examples where the arm defines an outer surface and the arm cover defines an upper surface and where the upper surface and the outer surface define an edge of the arm assembly.

Another example can include any of the above and/or below examples where the outer surface and the upper surface are perpendicular to one another.

Another example can include any of the above and/or below examples where the outer surface and the upper surface form an oblique angle relative to one another.

Another example includes a device comprising a hollow arm defining an outer surface and an inwardly facing surface. The outer surface defines a perimeter of the arm, and the inwardly facing surface defines an acute angle to the outer surface as measured relative to the perimeter. The device further comprises an arm cover defining an upper surface and an outwardly facing surface. The upper surface is perpendicular to the outer surface. The outwardly facing surface defines another acute angle relative to the upper surface effective that the outer surface and the upper surface collectively define an edge along the perimeter.

Another example can include any of the above and/or below examples where the inwardly facing surface comprises an upper inwardly facing surface, and the hollow arm includes an undercut below the upper inwardly facing surface, and the outwardly facing surface comprises an upper outwardly facing surface, and the arm cover includes an arm engaging region below the upper outwardly facing surface. The arm engaging region engages the undercut to bias the upper outwardly facing surface against the upper inwardly facing surface.

Another example includes a device comprising a hollow arm that has an open side and a cover engaging region around the open side. The cover engaging region defines a first width at the open side, a second width farther from the open side, and a third width that is farther from the open side than the first width and the second width, and the third width is less than the first width and greater than the second width. The device further comprises an arm cover that includes an arm engaging region that defines a fourth width at the open side, a fifth width farther from the open side, and a sixth width that is farther from the open side than the fourth width and the fifth width. The sixth width is greater than the fifth width, and the second width and less than the first width and the fourth width.

Another example can include any of the above and/or below examples where the hollow arm defines an outer surface, and the arm cover defines an upper surface that is perpendicular to the outer surface, and a joint between the hollow arm and the arm cover occurs on an edge defined by the outer surface and the upper surface.

Another example can include any of the above and/or below examples where the hollow arm defines an outer surface, and the arm cover defines an upper surface that is oblique relative to the outer surface, and a joint between the hollow arm and the arm cover occurs on an edge defined by the outer surface and the upper surface.

Another example can include any of the above and/or below examples where the hollow arm defines an outer surface, and the arm cover defines an upper surface that is oblique relative to the outer surface, and a joint between the hollow arm and the arm cover occurs on the outer surface or the upper surface.

Conclusion

Although techniques, methods, devices, systems, etc., pertaining to arm assemblies are described in language specific to structural features and/or methodological acts, it is to be understood that the subject matter defined in the appended claims is not limited to the specific features or acts described. Rather, the specific features and acts are disclosed as example forms of implementing the claimed methods, devices, systems, etc.

The invention claimed is:

1. A device, comprising:
a base assembly that is configured to define a lower axis of rotation;
a display assembly including a display that is configured to rotate around an upper axis of rotation; and,
an arm assembly extending from the base assembly at the lower axis of rotation to the display assembly at the upper axis of rotation, the arm assembly comprising a hollow arm and an arm cover, wherein the hollow arm includes an open side for receiving the arm cover, an outward facing surface of the arm cover defining a protuberance, the hollow arm defining an undercut within the open side, the protuberance of the arm cover contacting the undercut of the hollow arm to secure the hollow arm and the arm cover without fasteners and where the protuberance is concealed by an outer surface of the hollow arm and an upper surface of the arm cover.

2. The device of claim 1, wherein a single cross section of the arm cover taken transverse to a long axis of the hollow arm defines a first width proximate the open side, a second width, and a third width at the protuberance, the second width in between the first width and the third width, and wherein the second width is less than the first width and the third width.

3. The device of claim 2, wherein the hollow arm defines an outer surface and upper and lower inwardly facing surfaces that are neither parallel nor perpendicular to the outer surface, the lower inwardly facing surface being associated with the undercut, and wherein the first width is defined at an intersection of the outer surface and the upper inwardly facing surface.

4. The device of claim 3, wherein the second width is defined at an intersection of the upper inwardly facing surface and the lower inwardly facing surface.

5. The device of claim 3, wherein the third width is defined on the lower inwardly facing surface distal from the upper inwardly facing surface.

6. The device of claim 1, wherein the arm cover defines an upper surface and upper and lower outwardly facing surfaces, the lower outwardly facing surface being associated with the protuberance.

7. The device of claim 6, wherein a single cross section of the arm cover taken transverse to a long axis of the hollow arm defines a first width at the upper outwardly facing surface and a second width in between the first width and a third width, the single cross section defining the third width at the lower outwardly facing surface, and wherein the second width is less than the first width and the third width.

8. The device of claim 7, wherein the first width is defined at an intersection of the upper surface and the upper outwardly facing surface.

9. The device of claim 7, wherein the second width is defined at an intersection of the upper outwardly facing surface and the lower outwardly facing surface.

10. The device of claim 7, wherein the third width is defined on the lower outwardly facing surface distal from the upper outwardly facing surface.

11. The device of claim 7, wherein the hollow arm defines upper and lower inwardly facing surfaces and contact between the lower inwardly facing surface and the lower outwardly facing surface creates a downward force on the arm cover.

12. The device of claim 11, wherein the downward force keeps the upper outwardly facing surface in contact with the upper inwardly facing surface.

13. The device of claim 1, wherein the hollow arm defines an outer surface and the arm cover defines an upper surface and wherein the upper surface and the outer surface define an edge of the arm assembly.

14. The device of claim 13, wherein the outer surface and the upper surface are perpendicular to one another.

15. The device of claim 13, wherein the outer surface and the upper surface form an oblique angle relative to one another.

16. A device, comprising:
- a base assembly that is configured to define a lower axis of rotation;
- a display assembly including a display that is configured to rotate around an upper axis of rotation; and,
- an arm assembly extending from the base assembly at the lower axis of rotation to the display assembly at the upper axis of rotation, the arm assembly comprising:
  - a hollow arm defining a hollow interior space, the hollow arm having a outer surface and an inwardly facing surface, and
  - an arm cover having an upper surface and an outwardly facing surface, the hollow arm including an open side for receiving the arm cover, the outer surface of the hollow arm and the upper surface of the arm cover defining an outer perimeter of the arm assembly at a cross section of the arm assembly taken transverse to a long axis of the arm assembly, the inwardly facing surface of the hollow arm and the outwardly facing surface of the arm cover having a slanted profile that slopes back towards the outer surface of the hollow arm with increasing distance from the upper surface of the arm cover.

17. The device of claim 16, wherein the outwardly facing surface is inclined relative to the upper surface of the arm cover.

18. The device of claim 16, wherein the inwardly facing surface comprises an upper inwardly facing surface and the hollow arm includes an undercut below the upper inwardly facing surface and wherein the outwardly facing surface comprises an upper outwardly facing surface, and wherein the arm cover includes an arm engaging region below the upper outwardly facing surface, and wherein the arm engaging region engages the undercut to bias the upper outwardly facing surface against the upper inwardly facing surface.

19. A device, comprising:
- a base assembly that defines a lower axis of rotation;
- a display assembly including a display that rotates around an upper axis of rotation; and,
- an arm assembly extending from the base assembly at the lower axis of rotation to the display assembly at the upper axis of rotation, the arm assembly comprising:
  - a hollow arm defining an opening along an open side, the hollow arm including protuberances on either side of the opening that define an opening width along a cross-section of the arm assembly taken transverse to a long axis of the arm assembly, and
  - a removable arm cover positioned inside the opening of the hollow arm and contributing structurally to the hollow arm, wherein, an arm cover width along the cross-section at a location on the removable arm cover further inside the opening than the protuberances is greater than the opening width of the hollow arm at the protuberances, such that the hollow arm is temporarily deflected outwardly to widen the opening width while the removable arm cover is allowed to pass through to be secured in the opening.

20. The device of claim 19, wherein the opening width is the narrowest width of the opening at the cross-section.

* * * * *